United States Patent [19]

Thaler

[11] 4,328,566

[45] May 4, 1982

[54] DYNAMIC MEMORY REFRESH SYSTEM WITH ADDITIONAL REFRESH CYCLES

[75] Inventor: Michael Thaler, Norwalk, Conn.

[73] Assignee: Pitney Bowes Inc., Stamford, Conn.

[21] Appl. No.: 162,360

[22] Filed: Jun. 24, 1980

[51] Int. Cl.³ .............................................. G11C 11/40
[52] U.S. Cl. ..................................... 365/222; 365/189
[58] Field of Search ................................ 365/222, 189

[56] References Cited

U.S. PATENT DOCUMENTS

| | | | |
|---|---|---|---|
| 4,028,675 | 6/1977 | Frankenberg | 365/222 |
| 4,106,108 | 8/1978 | Cislaghi et al. | 365/222 |

*Primary Examiner*—Terrell W. Fears

*Attorney, Agent, or Firm*—David E. Pitchenik; William D. Soltow, Jr.; Albert W. Scribner

[57] ABSTRACT

The present invention is particularly directed to the enabling of a refresh cycle for a dynamic memory chip at a period in the fetch cycle, for example, of a type 8085 microprocessor, when the normal timing of the chip does not permit addressing of the memory. Specifically, in the fetch cycle, a fourth clock period occurs following a memory read pulse. This fourth clock cycle is required for the application of the microprocessor, but does not involve any addressing of the memory. Accordingly, in accordance with the invention, upon the occurrence of a memory read cycle, during which a normal refresh occurs, the refreshing circuitry is reactivated, so that a further refresh cycle will occur during this fourth clock.

7 Claims, 10 Drawing Figures

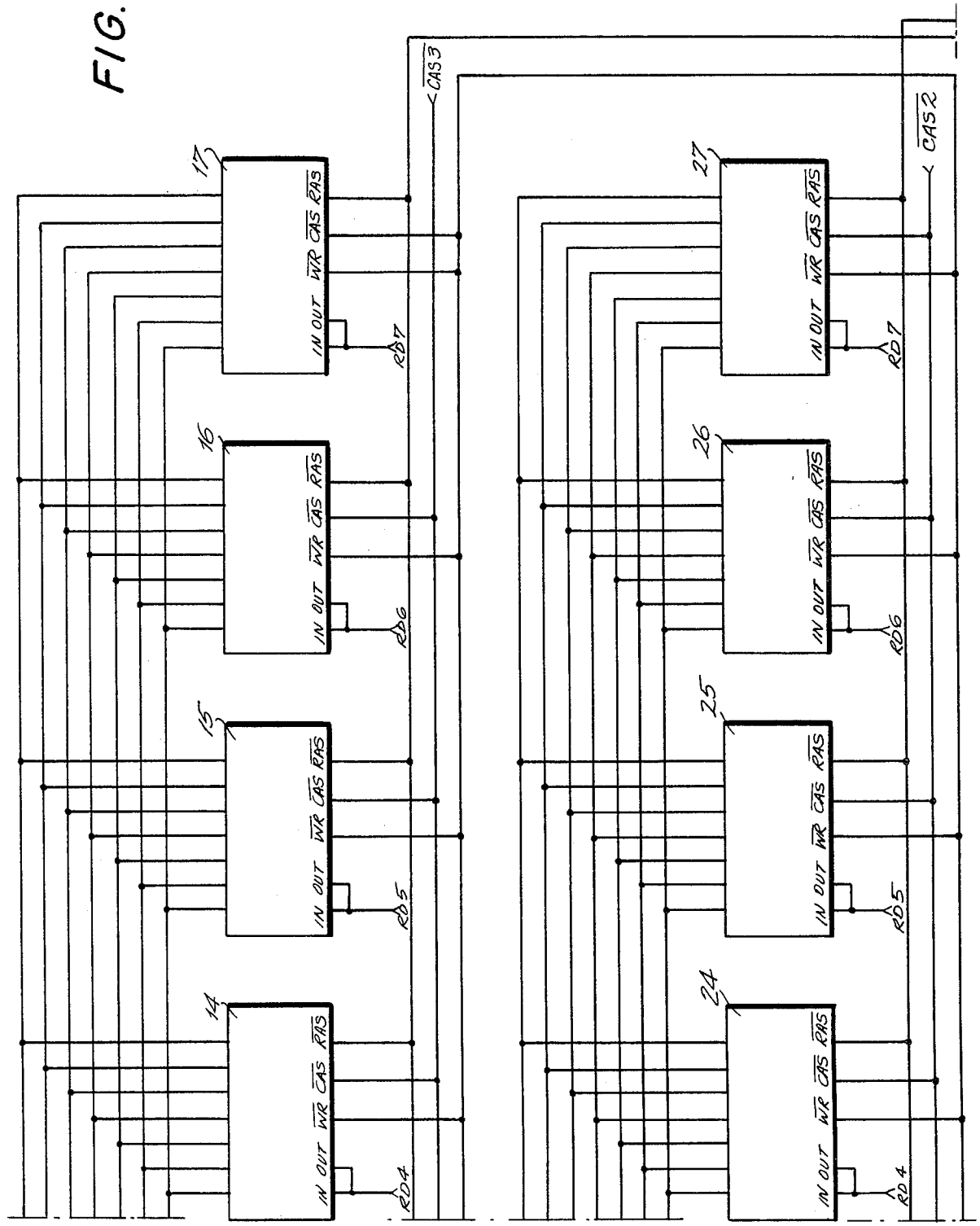

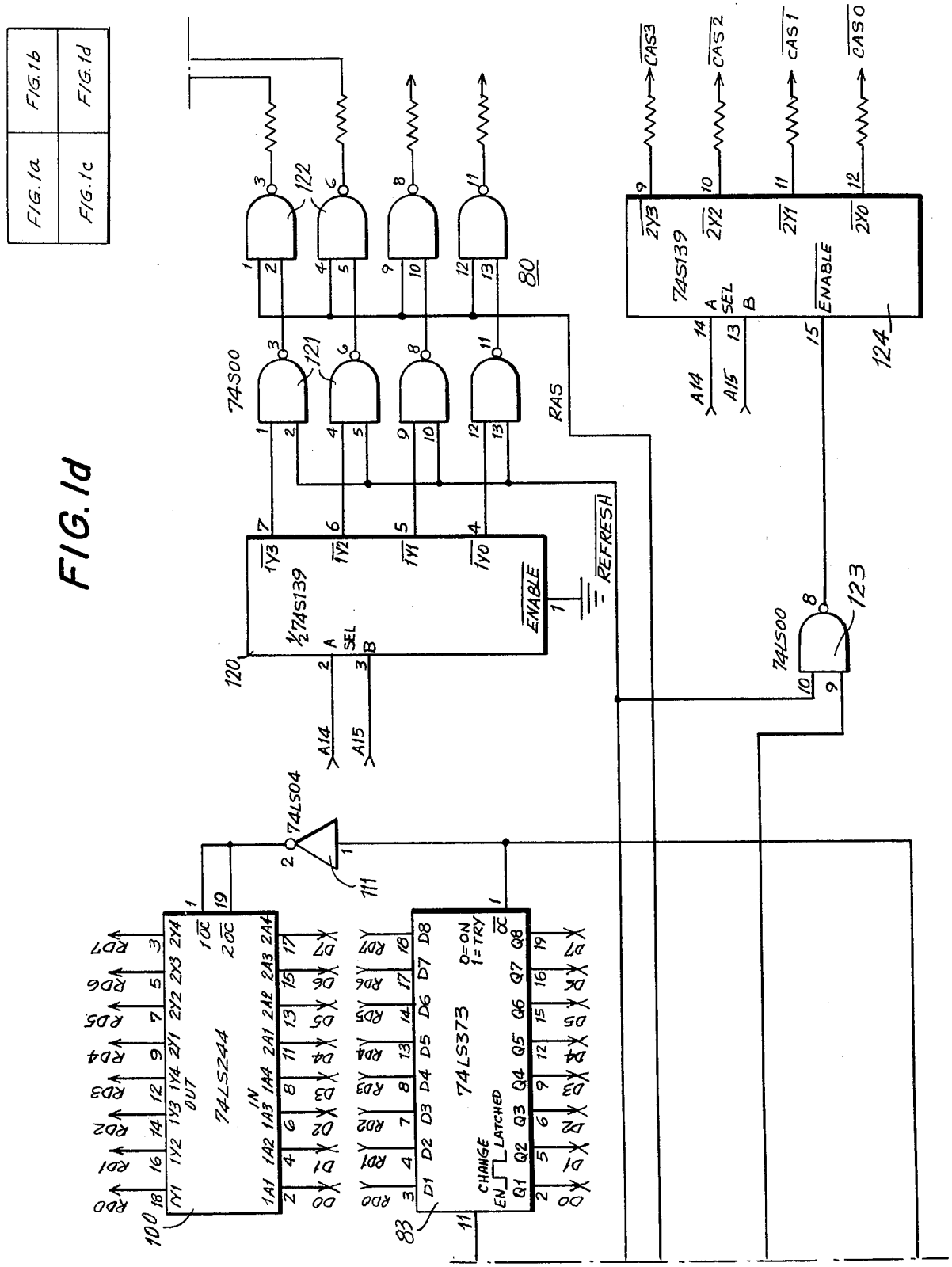

4,328,566

DYNAMIC MEMORY REFRESH SYSTEM WITH ADDITIONAL REFRESH CYCLES

BACKGROUND OF THE INVENTION

This invention relates to dynamic memory systems, and is more particularly directed to an improved transparent refreshing system for large capacity dynamic memory chips.

It is well known that dynamic memory chips must be periodically refreshed, in order that the data stored therein may be retained. While a refreshing action occurs when the chips are addressed, for read or write cycles, the retention of the data in the memories cannot depend upon such addressing, since the operations may not occur with sufficient rapidity to reliably insure the refreshing. For example, on a type 4116 dynamic chip, which has a capacity of 16 K, the entire chip must be refreshed at least once every two milliseconds.

It is of course undesirable to require refreshing at times that would interfere with the normal operation of a data processing system, and hence it is desirable to render the refreshing transparent to the system, for example, by refreshing at times when the memory could not be addressed.

SUMMARY OF THE INVENTION

The present invention is particularly directed to the enabling of a refresh cycle for a dynamic memory chip at a period in the fetch cycle, for example, of a type 8085 microprocessor, when the normal timing of the chip does not permit addressing of the memory. Specifically, in the fetch cycle, a fourth clock period occurs following a memory read pulse. This fourth clock cycle is required for the application of the microprocessor, but does not involve any addressing of the memory. Accordingly, in accordance with the invention, upon the occurrence of a memory read cycle, during which a normal refresh occurs, the refreshing circuitry is reactivated, so that a further refresh cycle will occur during this fourth clock.

It will of course be apparent that the same philosophy of providing a further refresh cycle may be applicable to other microprocessors.

BRIEF FIGURE DESCRIPTION

In order that the invention will be more clearly understood, it will now be disclosed in greater detail with reference to the accompanying drawings, wherein:

FIG. 1, including A–D, is a block diagram of a memory system in accordance with preferred embodiment of the invention;

FIG. 2 is a general block diagram of an 8085 microprocessor system;

FIG. 3 including A–C is a timing diagram of an 8085 system;

Figure 1A:
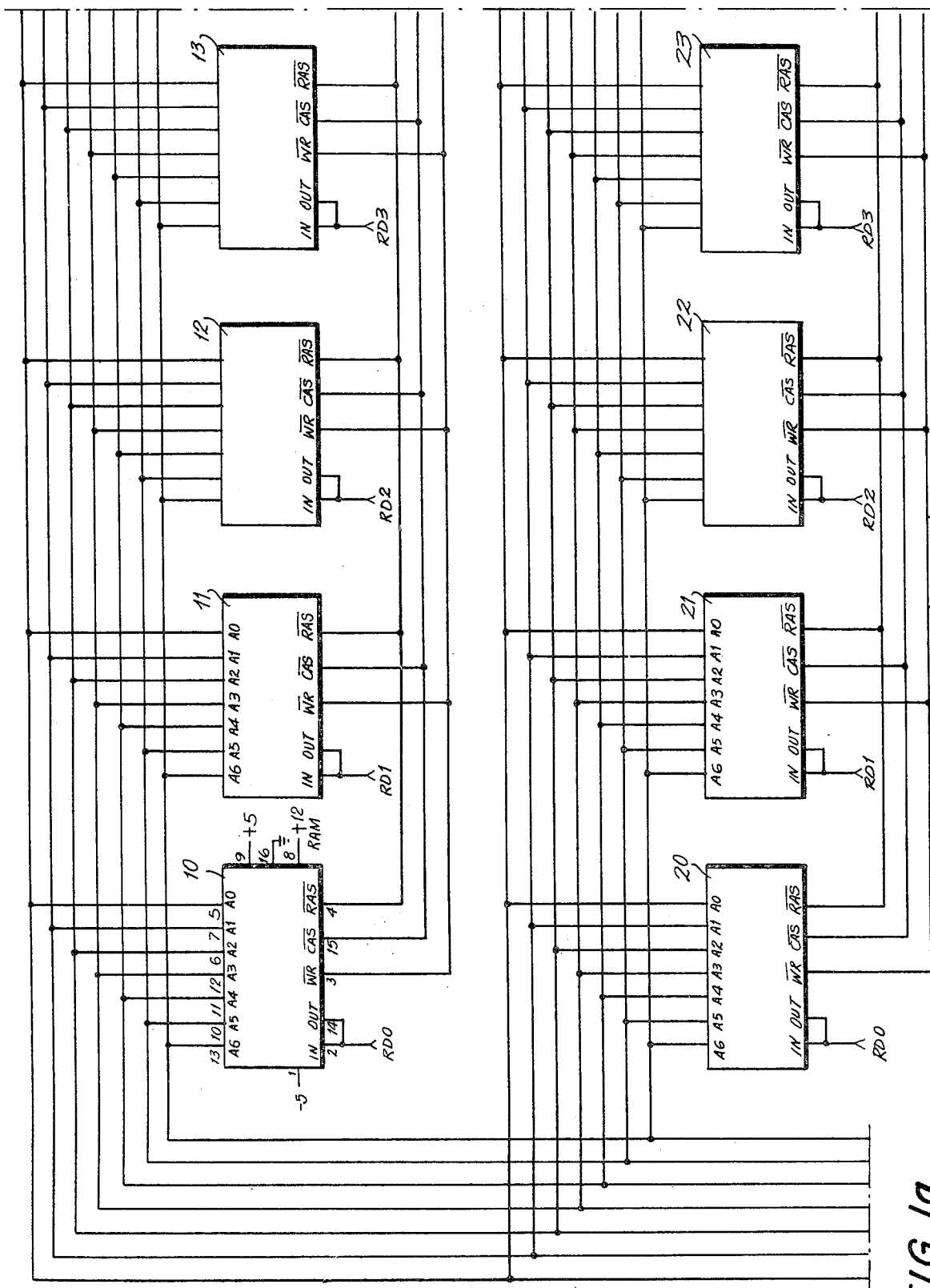
Figure 1C:
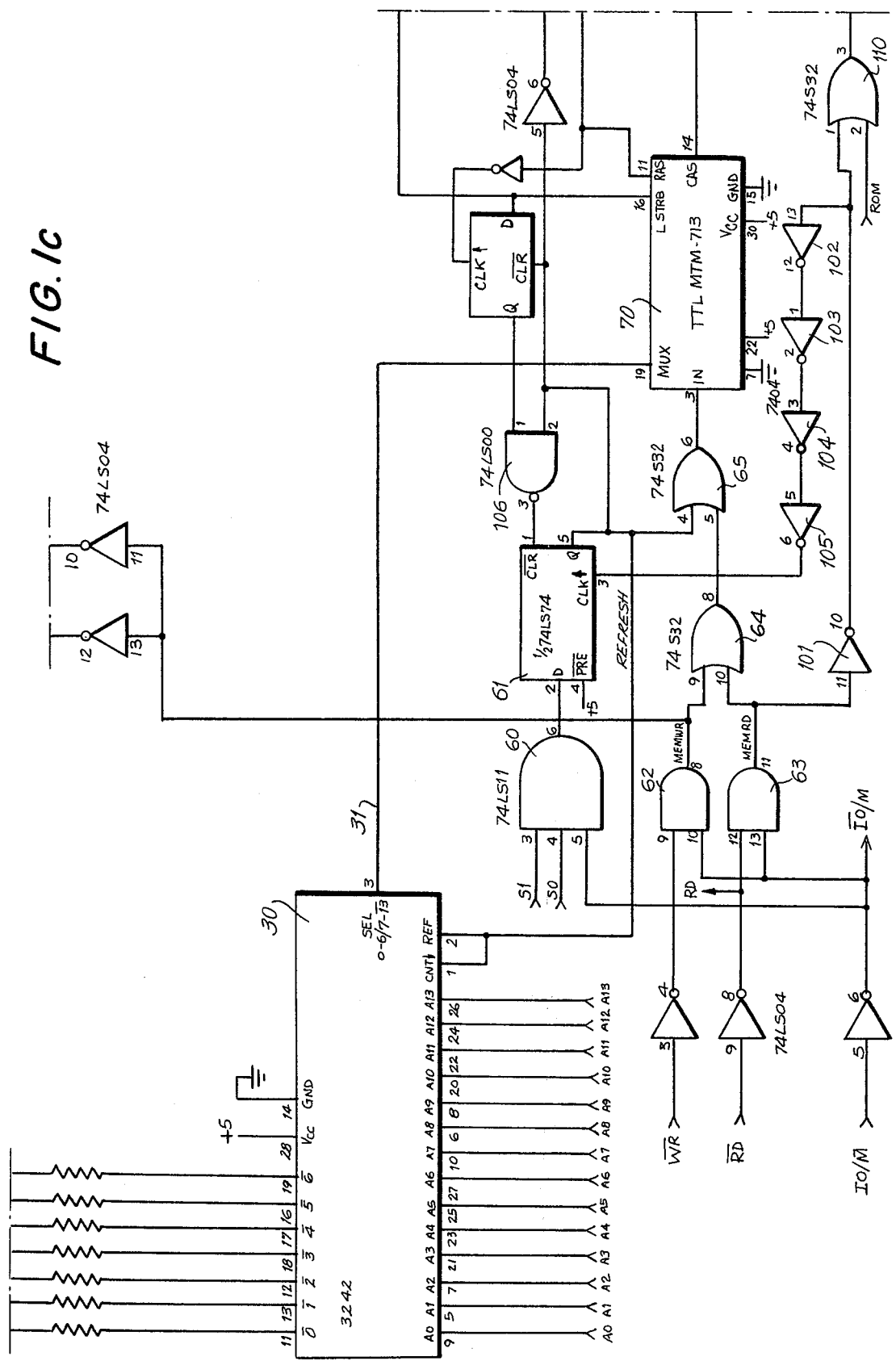

The system of the present invention, as illustrated in FIG. 1 of the drawings, is arranged for a 32 K memory, employing two rows of dynamic memory chips, such as the row of chips 10–17 and the row of chips 20–27. Each of the memory chips of these rows, in the disclosed embodiment of the invention, is a 16 K dynamic chip, for example, of the type 4116. It will of course be apparent that the invention is adaptable for use with other chip arrays, and with other types of chips.

In order to conserve terminals, each of the chips of this type has seven address terminals A0–A6. This arrangement thereby requires separate addressing for the rows and columns of cells in the memory chips. For this purpose, the chips are provided with row address selecting terminals, referred to as RAS terminals, and column address selecting terminals referred to as CAS terminals.

Since only seven address terminals are provided, the row and column addresses must be multiplexed, and for this purpose it is conventional to use an address multiplexing circuit, such as type 3242 Address Multiplexing and Refresh Control chip 30. The Address Multiplex chip 30 has seven address output terminals connected in parallel to the seven address terminals of the memory chips. The Address Multiplexing chip 30 also has 14 input terminals A0–A13 adapted to be connected to the address lines of an address bus, for example, of a microcomputer system. The other address lines of the bus, i.e. lines A14–A15 are employed in the enabling of the address selection terminals of the memories, in a manner that will be discussed in greater detail in the following paragraphs.

The address selection chip further has a selection terminal connected to a selection line 31, whereby when the level of the line 31 is high, the input address lines A0–A6 will be connected to the output address lines, and when the signal level on the line 31 is low, the address lines A7–A13 will be connected to the output address lines, in each case assuming that the signal level at the refresh enable terminal of this chip is low.

In dynamic memory chips, for example of the type 4116, it is conventional, in accessing of the chips, to first place a low on the $\overline{\text{RAS}}$ terminal, at the time the bus address lines A0–A6 are connected to the output address lines of the address selector, and to place a low on the $\overline{\text{CAS}}$ terminal when the bus address lines A7–A13 are connected to the output address lines of the address selector. In this manner, the row and column addresses of the memory chip are selected to provide an output to an output terminal or to enable writing of data at the particular address by way of an input terminal.

The dynamic memory chips are further provided with a $\overline{\text{WR}}$ terminal, which is responsive to a high signal for enabling reading of data from the chip and to a low signal for enabling writing of data into the cells of the chip.

In the use of dynamic memory, it is well known that it is required to refresh the data in the memories. For example, in the chips of type 4116, the cells of the memory must be refreshed at least once every two milliseconds. The charge of any one cell of the dynamic memory is refreshed every time that cell is accessed for a read or write operation. At such time, all the other cells in the same row are also refreshed. In a 16 K RAM such as the 4116, there are seven row addresses and seven column addresses. This then requires that there be 128 refresh cycles within each two milliseconds, since there are 128 possible row addresses.

In the operation of data processing equipment it is desirable that the refresh cycles be effected at times when it is not expected that the RAM's will be employed, so that the refreshing of the RAM's must be transparent to the system. Otherwise, it may be necessary for the program of the processing system to be interrupted, or for wait times to be introduced into the program, in order to insure the necessary refreshing of the memory.

The invention is particularly concerned with the transparent refreshing of dynamic memories in a microprocessing system employing a type 8085 microprocessor. It will of course be apparent that the invention will be adaptable to use with other microprocessors employing similar signal configurations.

Figure 2:
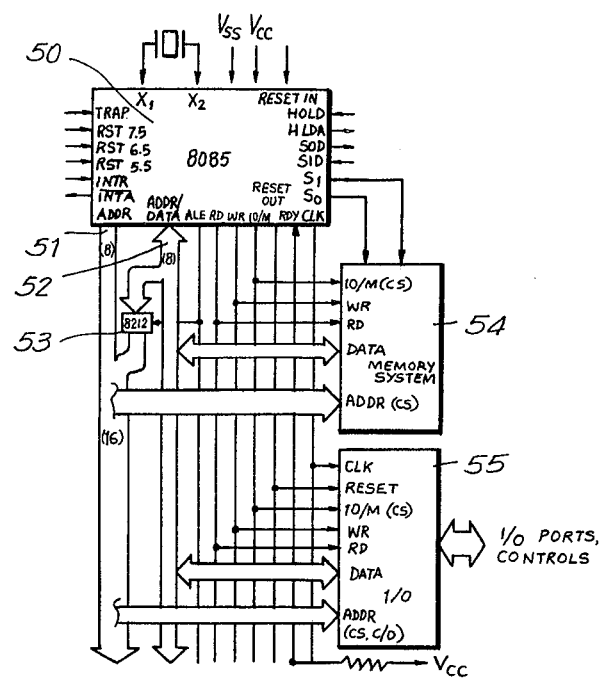

As illustrated in FIG. 2 an 8085 microprocessor chip 50 has eight address lines 51 dedicated to address, i.e. the high byte addresses A8–A15. In addition, a further eight lines 52 have multiplexed low byte address lines A0–A7 and the data lines. The addresses that are on the data lines may be separated by a input/output port chip 53, such as the type 8212. The address and data lines, and control lines, may be connected in conventional manner to a memory system 54, and an input/output system 55. The invention is concerned with the interfacing of the microprocessor system of FIG. 2 and the memory chips which are provided within the system 54.

Figure 3:
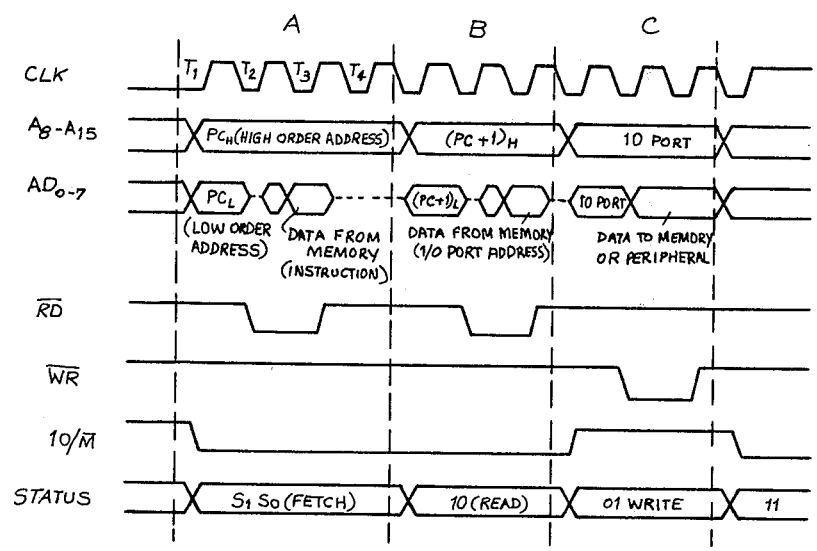

FIG. 3 shows a timing diagram of several of the signals outputted by the 8085 microprocessor chip. These signals are divided into a fetch sequence A, a read sequence B, and a write sequence C. It is noted that the fetch sequence A requires four clock periods $T_1$–$T_4$. This is a characteristic of the timing of the chips, and results in a clock period $T_4$ following the read pulse RD, at which time the system will not address the memory. Accordingly, in accordance with the invention, in an 8085 microprocessor system, this fourth clock period of the cycle will be employed in the refreshing of the dynamic memories.

Assuming that the clock rate of the system is about 3.0 megahertz, the clock period for refreshing will be about 330 nanoseconds. In order to select this fourth clock period, use is made of several of the output signals of the 8085 chip.

Two status signals $S_1$ and $S_2$ are provided by the 8085 chip, the status signals being related to the operation cycles of the microprocessor as shown in table I.

TABLE I

| $S_1$ | $S_0$ | |
|---|---|---|
| 0 | 0 | HALT |
| 0 | 1 | WRITE |
| 1 | 0 | READ |
| 1 | 1 | FETCH |

Since, as above discussed, the period selected for refreshing is in the Fetch cycle, it is evident that the status signals $S_1$ and $S_0$ must both be high.

A further signal 10/$\overline{M}$ is outputted from the 8085 microprocessor, for indicating whether the read/write operation is directed to the memory or to an input/output system. In the present instance, since the Fetch cycle is directed to operations with the memories, the 10/$\overline{M}$ signal must be low, as shown in FIG. 3.

The condition with the two status signals high and the 10/$\overline{M}$ signals low, is referred to as the Op code. These signals will thereby define the Fetch cycle, during which the refresh may transparently be effected following the read pulse.

Referring now to the block diagram of FIG. 1, it is seen that the signals $S_1$,$S_0$ and 10/$\overline{M}$ are applied to AND gate 60 so that the output of this gate goes high during an OP code. This high is applied to the D terminal of D type edge triggered flip-flop 51 which may be a type 74LS74. The Q output of this flip-flop is assumed to be low at this time, as a result of previous control, and does not become high until a positive going signal is applied to it's clock terminal.

The $\overline{WR}$ and $\overline{RD}$ signals from the microprocessor are also applied to the circuit of FIG. 1, and are inverted to provide active high signals. These signals, and the inverted 10/$\overline{M}$ signals are applied to a pair of an AND gates, 62 and 63 respectively, to produce active high write and read signals MEMWR and MEMRD respectively when the 10/$\overline{M}$ signals has its active low.

The MEMRD signal is applied by way of OR gates 64 and 65 to the input terminal of a Delay Generator 70.

The Delay Generator 70, which may be TTL MTM-713, manufactured by Engineered Components Co. of San Luis Obispo, Calif., is specifically designed for controlling refresh cycles in dynamic memories. This integrated circuit is responsive to positive going input transitions to provide an output sequence of positive pulses, in the following order:

1. A row address select pulse RAS
2. A multiplexing pulse MUX
3. A column address select pulse CAS
4. A latch stroke pulse LSTRB In the TTLMTM-713, the positive RAS pulse has a leading edge about 15 nanoseconds from the input leading edge, the MUX pulse has a leading edge about 40 nanoseconds from the input pulse leading edge, and the CAS pulse has a leading edge about 90 nanoseconds from the leading edge of the input pulse. Each of these pulses terminates about 240 nanoseconds following the leading edge of the input pulse. The LSTRB pulse has a leading edge at about 190 nanoseconds following the input pulse, this pulse terminating at about 290 nanoseconds following the input pulse.

The latch strobe pulse LSTRB is applied to an eight bit latch circuit 83, such as a type 74LS373. The data input terminals of this latch are connected to the output terminals of the memory chips, such that the output terminal of each chip in the given row is connected to a different data input terminal of the latch, such that each input terminal of the latch is connected to an output terminal of a single memory chip from each of the rows. It will also be noted that the input and output terminals of each of the chips is connected together. As a consequence, at this time the data from the enabled row of chips is stored in the latch 83. It is known that since charge leaks off the storage capacitors in a dynamic memory, the charge must be replenished periodically in order to enable the memory to retain its data. The charge in any one cell is replenished, or refreshed, every time that cell is accessed for read or write operation. At the same time, all the other cells having the same row address are also refreshed. A 16 K RAM chip can thus be refreshed in 128 cycles while sequencing through all of the row addresses. This 128 cycles must occur each two milliseconds, in the 4116 type of memory chip.

Figure 4:
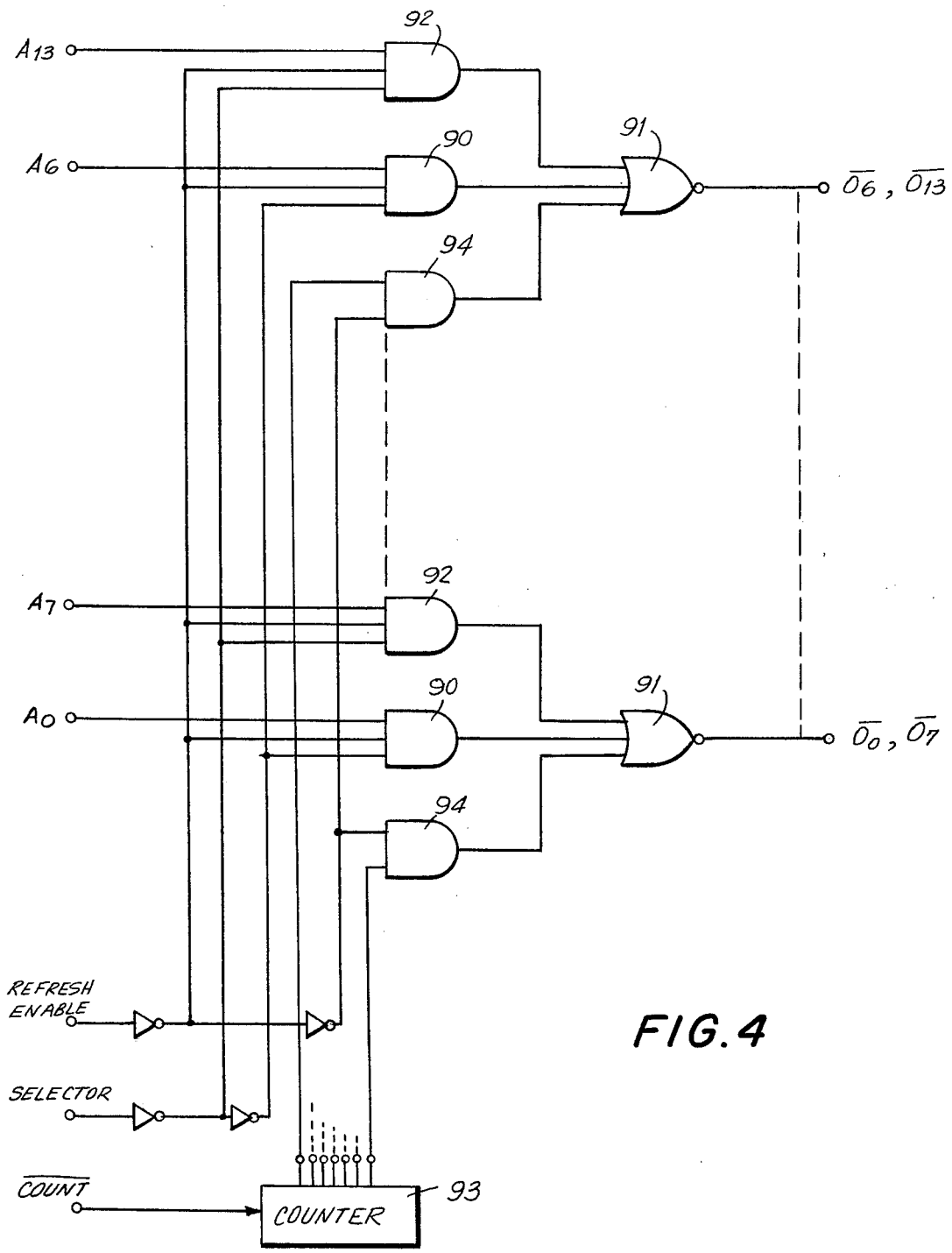
FIG. 4 is a simplified functional diagram of a conventional Address Multiplexer and Refresh Control device that may be employed in the invention.

The operation of the Address Multiplexer and Refresh Counter 30 will be more easily understood with reference to the following table II, and the partial logic diagram of this chip in FIG. 4.

TABLE II

| Refresh Enable | Selector | Output |
|---|---|---|
| H | X | Refresh addressing from internal counter |
| L | H | Row Address (A$_\phi$–A$_6$) |

TABLE II-continued

| Refresh Enable | Selector | Output |
|---|---|---|
| L | L | Column Address ($A_7$–$A_{13}$) |

The Address Multiplexer includes seven three-input AND gates 90 for coupling the low order address terminals to the output terminals, by way of NOR gates 91. In addition, seven three-input AND gates 92 couple the high order addresses to the output terminals, also by way of the NOR gates 91. The second input terminals of the AND gates 92 are high when the Refresh Enable signal is low. Consequently, the AND gates 90 pass the low order address levels to the output terminals, as row addresses, when the selector signal is high. Similarly, the AND gates 92 pass the high order address signals to the output terminals, as column addresses, when the selector signal is low. This constitutes the conventional addressing technique for the memory chips.

The Addressing Multiplexer and Refresh Control Chip further includes a seven position counter 93. This counter is set by active low signals at the $\overline{\text{Count}}$ terminal. When the Refresh Enable signal is high, high levels are applied to inputs of seven two input AND gates 94, whose outputs are also connected to the output terminals by way of respective NOR gates 91. In addition, the counting outputs of the counter 93 are separately applied to the seven AND gates 94. As a result, when the refresh enable signal is high, pulses sequentially appear at the output terminals, in response to the count pulses.

Figure 5:
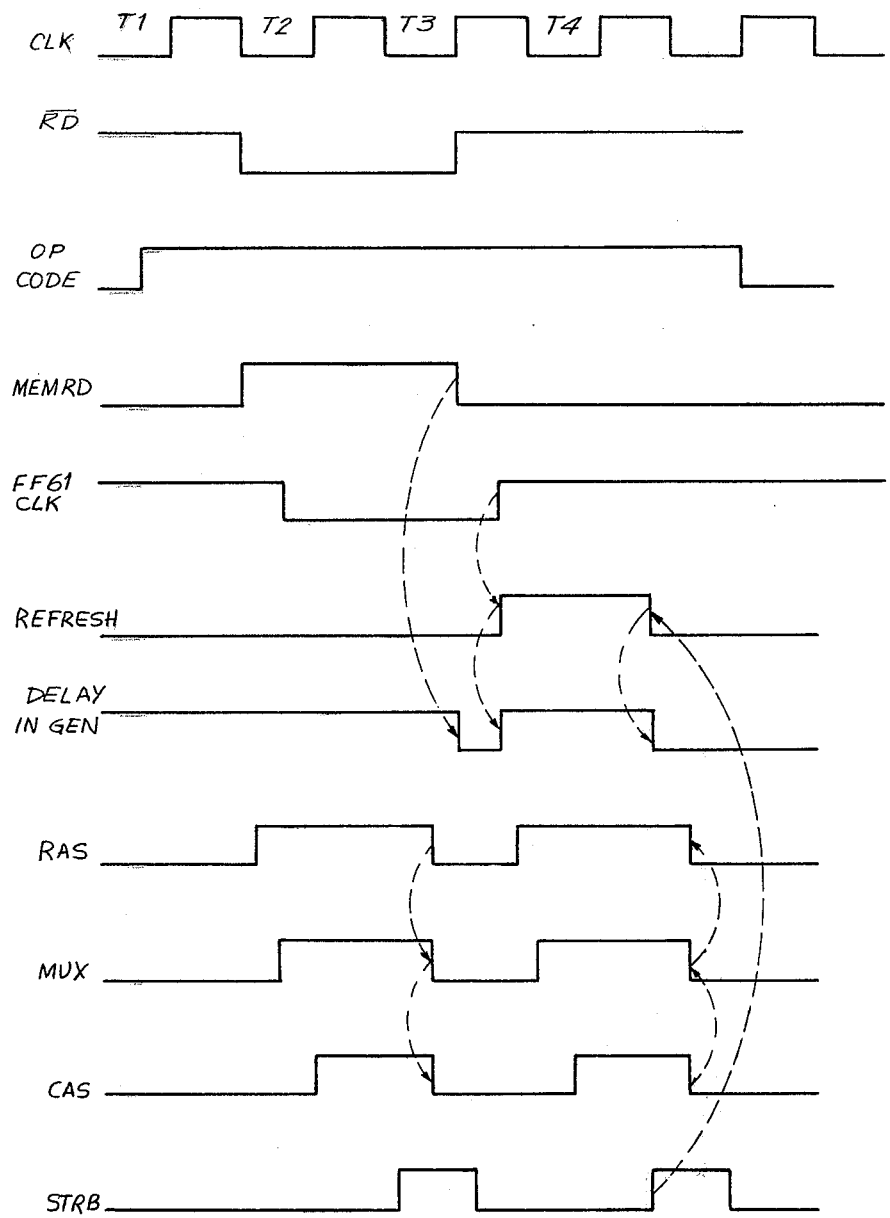
FIG. 5 is a timing diagram of the system in accordance with the invention.

In the operation of the circuit of FIG. 1 as is best understood by reference to the timing diagram of FIG. 5, it will be recalled that the refresh line is initially low, and that the MEMRD positive leading edge pulse is applied, by way of the OR gate 64 and OR gate 65 to the input of the Delay Generator 70. This triggers the Delay Generator, so that shortly thereafter the leading edge of the RAS pulse occurs. Since at this time the MUX pulse is low, and the selector for the Address Multiplexer 30 is low, so that one set of addresses is applied to the memory chips, constituting the low addresses. The MUX pulse next goes positive, to apply the other set of addresses to the memory chips, so that the following CAS pulse enables the latching of the column addresses. The LSTRB pulse then latches the data output in the data latch 83, for output, as desired, to the data bus of the system.

In completion of this cycle, the trailing edge of the memory read pulse resets the input of the Delay Generator to its low level.

It is thus apparent that the memory chips are controlled through a refresh cycle during the MEMRD pulse. The same sequence of events occurs during the MEMWR pulse, if the OP signal is present. It has been found, however, that, particularly with respect to a 16 K chip, adequate refreshing of the memory chips may not result if only the memory read and memory write pulses are depended upon. As discussed above, the period T4 of the Fetch cycle is available for refreshing, and hence, in accordance with the invention, the occurrence of the memory read cycle is detected by means of the series inverters 101–105, which, with a delay, apply a negative going pulse to the clock terminal of the flip-flop 61. This transition does not effect the clocking of the flip-flop, the clocking being effected at the positive going transition of this pulse, which occurs with a delay following the negative going transition of the memory read pulse. The positive going transition of the clock pulse of the flip-flop 61 effects the raising of the level at the Q terminal of this flip-flop to the high level applied to the D terminal, as above discussed. As a consequence, the refresh signal is now high, and this high signal is applied by way of the OR gate 65 to trigger the Delay Generator 70 for a second time. It will be noted that the delay effected by the inverters is necessary in order to insure the recovery of the Delay Generator following the initial sequence of output pulses. The Delay Generator thereupon produces a second series of RAS, MUX and CAS pulses, to effect another refresh cycle. Since, in this case, the refresh signal is high, the refresh is effected by internal counting within the Address Multiplexing chip 30.

The strobe pulse LSTRB, on its positive transition, results in a low at the output of the NAND gate 106, with the consequent clearing of the flip-flop 61 and the returning of the refresh signal to the low level. The circuit is now in reset condition, and is ready for another cycle. It will be noted that, since the memory write pulse does not effect clocking of the flip-flop 61, the second sequence of refreshing only occurs in response to the memory read pulse.

It will be noted that the latching of the latch 83, and the enabling of the driver 100, is inhibited by the memory read signal, applied to the eight bit latch by way of the inverter 101 and an OR gate 110, and to the driver 100 by way of a further inverter 111, in order to avoid conflicts between the RAM and the ROM memories. For this purpose, a ROM enable signal is also applied to the OR gate 110.

The high order address lines A14 and A15 are applied to a two to four line decoder 120, for example, a type 74S139. The selected outputs of this decoder are applied to separate NAND gates 121, the outputs of which in turn are applied to separate NAND gates 122. The $\overline{\text{Refresh}}$ signal is applied to the other inputs of the gate 121, and the RAS pulses are applied to the other inputs of the NAND gates 122 of the circuit 80. The outputs of one of the NAND gates 122 is applied to the $\overline{\text{RAS}}$ terminals of the memory chips 10–17, and the outputs of another of the NAND gates 122 is applied to the $\overline{\text{RAS}}$ terminals of the memory chips 20–27. As a consequence, the rows of chips 10–17 and 20–27 are selectively addressed, by the address bus lines A14 and A15.

Similarly, the CAS and $\overline{\text{Refresh}}$ signals are applied, by way of NAND gate 123, to enable a further two line to four line selector 124. One of the outputs of this decoder is applied to $\overline{\text{CAS}}$ terminals of the memory chips 10–17, and another of the output is applied to the $\overline{\text{CAS}}$ terminals of the memory chips 20–27. The decoder 124, then, selectively enables the column addressing of the memory chips of the two rows of chips, on the basis of the two high order address line levels. Further outputs from the other gates 122 and the other terminal of the decoder 124 may be applied to additional 16 K memory locations.

While the invention has been disclosed and described with reference to a single embodiment, it will be apparent that variations and modifications may be made therein, and it is intended in the following claims to cover each set variation and modification as follows within the true spirit and scope of the invention.

What is claimed is:

1. In a data processing system including a dynamic memory and a processor producing read and write signals and a control signal indicating the addressing of the memory; the improvement comprising a refresh circuit for the dynamic memory comprising means responsive to the combined occurrence of said control signal and said read signal for initiating refresh cycles in said dynamic memory both during the occurrence of said read signal and, separately, in the system clock pulse period following the read signal, and being further responsive to the combined occurrence of said control signal and said write signal for initiating a refresh cycle during said write signal.

2. A refresh system for data processor including a dynamic memory and a type 8085 microprocessor chip; comprising means responsive to the read and write signals from the microprocessing chip and directed to the memory for controlling refresh cycles in the memory during the occurrence of said read and write signals, and means responsive to said read signal when the memory is addressed for controlling a further refresh cycle in the clock period of the system immediately following the read signal.

3. A dynamic memory refresh system for a data processing system including a dynamic memory and a data processor producing first signals indicating a fetch cycle during which the dynamic memory is addressed, a read signal, and a write signal, comprising means responsive to said first signals for initiating refresh cycles in said memory during said read signal and write signal, and further means responsive to said first signals and read signal for initiating a further refresh cycle during the system clock cycle following the respective read signal.

4. The refresh system of claim 3 wherein said means for initiating said further refresh cycle comprises a D-type flip-flop, means applying the first signals to the D-terminal of said flip-flop, a delay circuit for clocking said flip-flop in response to said read signal, whereby an output from said flip-flop occurs following the termination of said read signal, and means responsive to the output of said flip-flop for controlling a dynamic refresh cycle in said memory.

5. The refresh system of claim 4 comprising a Delay Generator for producing row and column addressing signals for said memory, OR gate means applying said read and write signals to said Delay Generator, the output of said flip-flop also being connected to said Delay Generator by way of said OR gate means.

6. The refresh system of claim 5 comprising delay means applying said read signals to the clock input of said flip-flop.

7. The refresh system of claim 4 further comprising means responsive to the output of said flip-flop for controlling the refresh cycle of said memory independently of the address bus of said data processing system.

* * * * *